(12) United States Patent
van de Ven et al.

(10) Patent No.: US 9,398,654 B2
(45) Date of Patent: Jul. 19, 2016

(54) SOLID STATE LIGHTING APPARATUS AND METHODS USING INTEGRATED DRIVER CIRCUITRY

(71) Applicant: Cree, Inc., Durham, NC (US)

(72) Inventors: Antony P. van de Ven, Hong Kong (CN); Gerald H. Negley, Chapel Hill, NC (US); Terry Given, Papakura (NZ)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/292,026

(22) Filed: May 30, 2014

(65) Prior Publication Data

US 2014/0268778 A1    Sep. 18, 2014

Related U.S. Application Data

(63) Continuation of application No. 13/192,755, filed on Jul. 28, 2011, now Pat. No. 8,742,671.

(51) Int. Cl.
*H05B 37/00* (2006.01)
*H05B 33/08* (2006.01)
*F21K 99/00* (2016.01)
*F21Y 101/02* (2006.01)

(52) U.S. Cl.
CPC ............ *H05B 33/0824* (2013.01); *F21K 9/135* (2013.01); *F21Y 2101/02* (2013.01)

(58) Field of Classification Search
USPC .................. 315/250–253, 312; 345/204–206
See application file for complete search history.

(56) References Cited

U.S. PATENT DOCUMENTS

| | | |
|---|---|---|
| 446,142 A | 2/1891 | Martin |
| D188,916 S | 9/1960 | Harling |
| D207,867 S | 6/1967 | Pettengill |
| 3,560,728 A | 2/1971 | Atkin |
| 3,638,042 A | 1/1972 | Studtmann |
| 3,655,988 A | 4/1972 | Nakamura et al. |
| 3,755,697 A | 8/1973 | Miller |
| 3,787,752 A | 1/1974 | Delay |
| 3,913,098 A | 10/1975 | Nakamura et al. |
| 4,090,189 A | 5/1978 | Fisler |
| 4,504,776 A | 3/1985 | Haville |
| 4,717,868 A | 1/1988 | Peterson |

(Continued)

FOREIGN PATENT DOCUMENTS

| | | |
|---|---|---|
| CN | 1575623 A | 2/2005 |
| CN | 1943276 A | 4/2007 |

(Continued)

OTHER PUBLICATIONS

U.S. Appl. No. 12/328,144, filed Dec. 4, 2008, Chobot.

(Continued)

*Primary Examiner* — Minh D A
(74) *Attorney, Agent, or Firm* — Myers Bigel & Sibley, P.A.

(57) ABSTRACT

A lighting apparatus includes a first substrate including a switching circuit, the switching circuit including a first port, a second port and a current control circuit configured to generate a current at the second port of the current control circuit responsive to a varying voltage at the first port. The apparatus further includes a second substrate mounted on the first substrate and including at least two LEDs electrically coupled to the second port of the current control circuit of the first substrate.

20 Claims, 7 Drawing Sheets

(56) References Cited

U.S. PATENT DOCUMENTS

| | | |
|---|---|---|
| 4,798,983 A | 1/1989 | Mori |
| 4,839,535 A | 6/1989 | Miller |
| 4,841,422 A | 6/1989 | Groh |
| 4,918,487 A | 4/1990 | Coulter, Jr. |
| 5,059,788 A | 10/1991 | Tashiro et al. |
| 5,059,890 A | 10/1991 | Yoshikawa et al. |
| 5,125,675 A | 6/1992 | Engelbrecht |
| 5,138,541 A | 8/1992 | Kano |
| 5,151,679 A | 9/1992 | Dimmick |
| 5,175,528 A | 12/1992 | Choi et al. |
| 5,334,916 A | 8/1994 | Noguchi |
| 5,345,167 A | 9/1994 | Hasegawa et al. |
| 5,357,120 A | 10/1994 | Mori |
| 5,397,938 A | 3/1995 | Wilhelm et al. |
| 5,467,049 A | 11/1995 | Kida et al. |
| 5,504,448 A | 4/1996 | Bennett et al. |
| 5,528,467 A | 6/1996 | Jiang |
| 5,598,068 A | 1/1997 | Shirai |
| 5,631,190 A | 5/1997 | Negley |
| 5,646,760 A | 7/1997 | Kuijk et al. |
| 5,661,645 A | 8/1997 | Hochstein |
| D384,430 S | 9/1997 | Lecluze |
| 5,736,881 A | 4/1998 | Ortiz |
| 5,798,520 A | 8/1998 | Kuijk et al. |
| 5,803,579 A | 9/1998 | Turnbull et al. |
| D400,280 S | 10/1998 | Leen |
| 5,844,377 A | 12/1998 | Anderson et al. |
| 5,912,477 A | 6/1999 | Negley |
| 5,912,568 A | 6/1999 | Kiley |
| 5,929,568 A | 7/1999 | Eggers |
| 5,941,626 A | 8/1999 | Yamuro |
| D418,620 S | 1/2000 | Grossman |
| D425,024 S | 5/2000 | Klaus et al. |
| 6,079,852 A | 6/2000 | Kamaya et al. |
| 6,137,235 A | 10/2000 | Franck |
| 6,150,771 A | 11/2000 | Perry |
| 6,153,980 A | 11/2000 | Marshall et al. |
| 6,161,910 A | 12/2000 | Reisenauer et al. |
| D437,439 S | 2/2001 | Tang |
| 6,201,353 B1 | 3/2001 | Chang et al. |
| 6,222,172 B1 | 4/2001 | Fossum et al. |
| 6,264,354 B1 | 7/2001 | Motilal |
| 6,285,139 B1 | 9/2001 | Ghanem |
| 6,323,597 B1 | 11/2001 | Janning |
| 6,329,760 B1 | 12/2001 | Bebenroth |
| 6,329,764 B1 | 12/2001 | van de Ven |
| 6,340,868 B1 | 1/2002 | Lys et al. |
| 6,350,041 B1 | 2/2002 | Tarsa et al. |
| 6,362,578 B1 | 3/2002 | Swanson et al. |
| 6,388,393 B1 | 5/2002 | Illingworth |
| 6,400,101 B1 | 6/2002 | Biebl et al. |
| 6,411,155 B2 | 6/2002 | Pezzani |
| 6,441,558 B1 | 8/2002 | Muthu et al. |
| 6,498,440 B2 | 12/2002 | Stam et al. |
| 6,501,630 B1 | 12/2002 | Colclaser et al. |
| 6,515,434 B1 | 2/2003 | Biebl |
| 6,528,954 B1 | 3/2003 | Lys et al. |
| 6,556,067 B2 | 4/2003 | Henry |
| 6,577,072 B2 | 6/2003 | Saito et al. |
| 6,586,890 B2 | 7/2003 | Min et al. |
| 6,600,175 B1 | 7/2003 | Baretz et al. |
| 6,614,358 B1 | 9/2003 | Hutchison et al. |
| 6,630,801 B2 | 10/2003 | Schuurmans |
| 6,636,003 B2 | 10/2003 | Rahm et al. |
| 6,697,130 B2 | 2/2004 | Weindorf et al. |
| 6,724,376 B2 | 4/2004 | Sakura et al. |
| D490,181 S | 5/2004 | Redfern |
| 6,747,420 B2 | 6/2004 | Barth et al. |
| 6,753,661 B2 | 6/2004 | Muthu et al. |
| 6,755,550 B1 | 6/2004 | Lackey |
| 6,784,622 B2 | 8/2004 | Newman, Jr. et al. |
| 6,788,011 B2 | 9/2004 | Mueller et al. |
| 6,791,840 B2 | 9/2004 | Chun |
| 6,808,287 B2 | 10/2004 | Lebens et al. |
| 6,836,081 B2 | 12/2004 | Swanson et al. |
| 6,841,947 B2 | 1/2005 | Berg-johansen |
| 6,864,641 B2 | 3/2005 | Dygert |
| 6,873,203 B1 | 3/2005 | Latham, II et al. |
| 6,885,035 B2 | 4/2005 | Bhat et al. |
| 6,987,787 B1 | 1/2006 | Mick |
| 6,995,518 B2 | 2/2006 | Havlik et al. |
| 6,998,594 B2 | 2/2006 | Gaines et al. |
| 7,014,341 B2 | 3/2006 | King et al. |
| 7,038,399 B2 | 5/2006 | Lys et al. |
| 7,067,995 B2 | 6/2006 | Gunter et al. |
| 7,071,762 B2 | 7/2006 | Xu et al. |
| 7,081,722 B1 | 7/2006 | Huynh et al. |
| 7,088,059 B2 | 8/2006 | McKinney et al. |
| 7,091,874 B2 | 8/2006 | Smithson |
| 7,108,238 B2 | 9/2006 | Gauci |
| 7,109,664 B2 | 9/2006 | Wu |
| 7,119,498 B2 | 10/2006 | Baldwin et al. |
| 7,144,140 B2 | 12/2006 | Sun et al. |
| 7,180,487 B2 | 2/2007 | Kamikawa et al. |
| 7,202,608 B2 | 4/2007 | Robinson et al. |
| 7,213,940 B1 | 5/2007 | Van De Ven et al. |
| 7,218,056 B1 | 5/2007 | Harwood |
| D544,979 S | 6/2007 | Hartmann et al. |
| 7,226,189 B2 | 6/2007 | Lee et al. |
| 7,233,831 B2 | 6/2007 | Blackwell |
| 7,245,089 B2 | 7/2007 | Yang |
| 7,271,545 B2 | 9/2007 | Hu et al. |
| 7,291,983 B2 | 11/2007 | Hu et al. |
| D557,853 S | 12/2007 | Sandell |
| D558,374 S | 12/2007 | Sandell |
| 7,307,391 B2 | 12/2007 | Shan |
| 7,344,275 B2 | 3/2008 | Allen et al. |
| 7,352,138 B2 | 4/2008 | Lys et al. |
| 7,358,679 B2 | 4/2008 | Lys et al. |
| 7,408,308 B2 | 8/2008 | Sawada et al. |
| D576,964 S | 9/2008 | Shaner |
| 7,427,838 B2 | 9/2008 | Hosoya |
| 7,432,668 B2 | 10/2008 | Zwanenburg et al. |
| 7,439,945 B1 | 10/2008 | Awalt et al. |
| 7,458,706 B1 | 12/2008 | Liu et al. |
| 7,513,639 B2 | 4/2009 | Wang |
| 7,515,128 B2 | 4/2009 | Dowling |
| 7,535,180 B2 | 5/2009 | Negley et al. |
| 7,550,934 B1 | 6/2009 | Deng et al. |
| 7,566,154 B2 | 7/2009 | Gloisten et al. |
| 7,576,496 B2 | 8/2009 | Duggal et al. |
| 7,614,767 B2 | 11/2009 | Zulim et al. |
| 7,614,769 B2 | 11/2009 | Sell |
| 7,628,513 B2 | 12/2009 | Chiu |
| 7,637,635 B2 | 12/2009 | Xiao et al. |
| 7,649,326 B2 | 1/2010 | Johnson et al. |
| D610,291 S | 2/2010 | Yoshinobu et al. |
| 7,656,371 B2 | 2/2010 | Shimizu et al. |
| 7,677,767 B2 | 3/2010 | Chyn |
| 7,679,292 B2 | 3/2010 | Allen et al. |
| 7,688,002 B2 | 3/2010 | Ashdown et al. |
| D618,376 S | 6/2010 | Redfern et al. |
| 7,758,223 B2 | 7/2010 | Osawa et al. |
| 7,772,757 B2 | 8/2010 | Kane et al. |
| 7,780,318 B2 | 8/2010 | Xiao et al. |
| 7,781,979 B2 | 8/2010 | Lys |
| 7,804,256 B2 | 9/2010 | Melanson |
| D625,038 S | 10/2010 | Yoo |
| 7,812,553 B2 | 10/2010 | Kang et al. |
| 7,821,023 B2 | 10/2010 | Yuan et al. |
| 7,821,194 B2 | 10/2010 | Negley et al. |
| D627,502 S | 11/2010 | Zheng et al. |
| D627,911 S | 11/2010 | Mo et al. |
| 7,824,075 B2 | 11/2010 | Maxik |
| 7,862,201 B2 | 1/2011 | Ge et al. |
| 7,862,214 B2 | 1/2011 | Trott et al. |
| 7,871,184 B2 | 1/2011 | Peng |
| D633,099 S | 2/2011 | Van De Ven et al. |
| 7,914,902 B2 | 3/2011 | Kao et al. |
| D636,921 S | 4/2011 | Van de Ven |
| D636,922 S | 4/2011 | Yoshida et al. |
| D638,160 S | 5/2011 | Van de Ven et al. |
| 7,967,652 B2 | 6/2011 | Emerson |
| 7,994,725 B2 | 8/2011 | Bouchard |

(56) References Cited

U.S. PATENT DOCUMENTS

| | | |
|---|---|---|
| 8,008,845 B2 | 8/2011 | Van de Ven |
| D646,011 S | 9/2011 | Rashidi |
| 8,148,911 B2 | 4/2012 | Chen et al. |
| 8,157,422 B2 | 4/2012 | Paik et al. |
| 8,174,201 B2 | 5/2012 | Lee |
| 8,188,682 B2 | 5/2012 | Nalbant |
| 8,207,685 B2 | 6/2012 | Cheng et al. |
| 8,235,555 B2 | 8/2012 | Thomas et al. |
| 8,242,704 B2 | 8/2012 | Lethellier |
| 8,246,202 B2 | 8/2012 | Mart et al. |
| 8,294,388 B2 | 10/2012 | Wong et al. |
| 8,508,140 B2 | 8/2013 | Leung et al. |
| 8,519,630 B2 | 8/2013 | Wang et al. |
| 8,525,774 B2 | 9/2013 | Lin et al. |
| 8,618,748 B2 | 12/2013 | Shiu et al. |
| 8,791,641 B2 | 7/2014 | van de Ven et al. |
| 8,970,131 B2 * | 3/2015 | Brandes et al. ............... 315/299 |
| 2001/0032985 A1 | 10/2001 | Bhat et al. |
| 2002/0027453 A1 | 3/2002 | Kulhalli et al. |
| 2002/0043943 A1 | 4/2002 | Menzer et al. |
| 2002/0047624 A1 | 4/2002 | Stam et al. |
| 2002/0063534 A1 | 5/2002 | Min |
| 2002/0070914 A1 | 6/2002 | Bruning et al. |
| 2002/0097095 A1 | 7/2002 | Jeon et al. |
| 2002/0139987 A1 | 10/2002 | Collins, III et al. |
| 2004/0036418 A1 | 2/2004 | Rooke et al. |
| 2004/0042205 A1 | 3/2004 | Tanabe et al. |
| 2004/0046510 A1 | 3/2004 | Allen |
| 2004/0189218 A1 | 9/2004 | Leong et al. |
| 2004/0208009 A1 | 10/2004 | Mardon et al. |
| 2004/0233145 A1 | 11/2004 | Chiang |
| 2004/0245946 A1 | 12/2004 | Halter |
| 2005/0007164 A1 | 1/2005 | Callahan, Jr. |
| 2005/0057179 A1 | 3/2005 | Madhani et al. |
| 2005/0111222 A1 | 5/2005 | Olsson et al. |
| 2005/0127381 A1 | 6/2005 | Vitta et al. |
| 2005/0128750 A1 | 6/2005 | Choi et al. |
| 2005/0128752 A1 | 6/2005 | Ewington et al. |
| 2005/0140282 A1 * | 6/2005 | Park ...................... H01L 27/322 |
| | | 313/505 |
| 2005/0169015 A1 | 8/2005 | Luk et al. |
| 2005/0174065 A1 | 8/2005 | Janning |
| 2005/0179629 A1 | 8/2005 | Inoue |
| 2005/0242742 A1 | 11/2005 | Cheang et al. |
| 2005/0254234 A1 | 11/2005 | Wang |
| 2005/0276053 A1 | 12/2005 | Nortrup et al. |
| 2005/0280376 A1 | 12/2005 | Hamidian et al. |
| 2006/0016960 A1 | 1/2006 | Morgan et al. |
| 2006/0018664 A1 | 1/2006 | Levinson et al. |
| 2006/0049782 A1 | 3/2006 | Vornsand et al. |
| 2006/0060882 A1 | 3/2006 | Ohe et al. |
| 2006/0153511 A1 | 7/2006 | Franklin et al. |
| 2006/0176411 A1 | 8/2006 | Furukawa |
| 2006/0221609 A1 | 10/2006 | Ryan, Jr. |
| 2006/0238465 A1 | 10/2006 | Kurumisawa |
| 2006/0244396 A1 | 11/2006 | Bucur |
| 2006/0255753 A1 | 11/2006 | Sawada et al. |
| 2006/0261754 A1 | 11/2006 | Lee |
| 2006/0273331 A1 | 12/2006 | Lim et al. |
| 2007/0013620 A1 | 1/2007 | Tanahashi et al. |
| 2007/0013647 A1 | 1/2007 | Lee et al. |
| 2007/0018594 A1 | 1/2007 | Janning |
| 2007/0040512 A1 | 2/2007 | Jungwirth et al. |
| 2007/0096661 A1 | 5/2007 | Allen |
| 2007/0108843 A1 | 5/2007 | Preston et al. |
| 2007/0115228 A1 | 5/2007 | Roberts et al. |
| 2007/0115662 A1 | 5/2007 | Roberts et al. |
| 2007/0137074 A1 | 6/2007 | Van de Ven |
| 2007/0139920 A1 | 6/2007 | Van de Ven |
| 2007/0139923 A1 | 6/2007 | Negley |
| 2007/0170447 A1 | 7/2007 | Negley |
| 2007/0171145 A1 | 7/2007 | Coleman |
| 2007/0182338 A1 | 8/2007 | Shteynberg et al. |
| 2007/0182346 A1 | 8/2007 | Shteynberg et al. |
| 2007/0182347 A1 | 8/2007 | Shteynberg et al. |
| 2007/0195023 A1 | 8/2007 | Kang et al. |
| 2007/0215027 A1 | 9/2007 | MacDonald et al. |
| 2007/0235751 A1 | 10/2007 | Radkov et al. |
| 2007/0236911 A1 | 10/2007 | Negley |
| 2007/0236920 A1 | 10/2007 | Snyder |
| 2007/0247414 A1 | 10/2007 | Roberts |
| 2007/0257623 A1 | 11/2007 | Johnson et al. |
| 2007/0257999 A1 | 11/2007 | Chou |
| 2007/0262724 A1 | 11/2007 | Mednik et al. |
| 2007/0263393 A1 | 11/2007 | Van de Ven |
| 2007/0267978 A1 | 11/2007 | Shteynberg et al. |
| 2007/0267983 A1 | 11/2007 | Van de Ven |
| 2007/0273299 A1 | 11/2007 | Miskin et al. |
| 2007/0274063 A1 | 11/2007 | Negley |
| 2007/0274080 A1 | 11/2007 | Negley |
| 2007/0278503 A1 | 12/2007 | Van de Ven |
| 2007/0278934 A1 | 12/2007 | Van de Ven |
| 2007/0278974 A1 | 12/2007 | van de Ven |
| 2007/0279440 A1 | 12/2007 | Negley |
| 2007/0279903 A1 | 12/2007 | Negley |
| 2007/0280624 A1 | 12/2007 | Negley |
| 2007/0285031 A1 | 12/2007 | Shteynberg et al. |
| 2008/0018261 A1 | 1/2008 | Kastner |
| 2008/0024071 A1 | 1/2008 | Yu |
| 2008/0030993 A1 | 2/2008 | Narendran et al. |
| 2008/0048567 A1 | 2/2008 | Steele et al. |
| 2008/0054281 A1 | 3/2008 | Narendran et al. |
| 2008/0062070 A1 | 3/2008 | De Oto et al. |
| 2008/0084685 A1 | 4/2008 | Van de Ven |
| 2008/0084700 A1 | 4/2008 | Van de Ven |
| 2008/0084701 A1 | 4/2008 | Van de Ven |
| 2008/0088248 A1 | 4/2008 | Myers |
| 2008/0089053 A1 | 4/2008 | Negley |
| 2008/0089071 A1 | 4/2008 | Wang |
| 2008/0094000 A1 | 4/2008 | Yamamoto et al. |
| 2008/0094829 A1 | 4/2008 | Narendran et al. |
| 2008/0105887 A1 | 5/2008 | Narendran et al. |
| 2008/0106895 A1 | 5/2008 | Van de Ven |
| 2008/0106907 A1 | 5/2008 | Trott |
| 2008/0112168 A1 | 5/2008 | Pickard |
| 2008/0112170 A1 | 5/2008 | Trott |
| 2008/0112183 A1 | 5/2008 | Negley |
| 2008/0116818 A1 | 5/2008 | Shteynberg et al. |
| 2008/0117500 A1 | 5/2008 | Narendran et al. |
| 2008/0122376 A1 | 5/2008 | Lys |
| 2008/0128718 A1 | 6/2008 | Sumitani |
| 2008/0129220 A1 | 6/2008 | Shteynberg et al. |
| 2008/0130283 A1 | 6/2008 | Chang |
| 2008/0130285 A1 | 6/2008 | Negley |
| 2008/0136313 A1 | 6/2008 | Van de Ven |
| 2008/0137347 A1 | 6/2008 | Trott |
| 2008/0150440 A1 | 6/2008 | Hsu |
| 2008/0157688 A1 | 7/2008 | Gibboney |
| 2008/0179602 A1 | 7/2008 | Negley et al. |
| 2008/0186704 A1 | 8/2008 | Chou et al. |
| 2008/0203946 A1 | 8/2008 | Ito et al. |
| 2008/0211415 A1 | 9/2008 | Altamura |
| 2008/0215279 A1 | 9/2008 | Salsbury et al. |
| 2008/0252197 A1 | 10/2008 | Li et al. |
| 2008/0258628 A1 | 10/2008 | Higley et al. |
| 2008/0259589 A1 | 10/2008 | Van de Ven |
| 2008/0278928 A1 | 11/2008 | Van de Ven |
| 2008/0278940 A1 | 11/2008 | Van de Ven |
| 2008/0278950 A1 | 11/2008 | Pickard |
| 2008/0278952 A1 | 11/2008 | Trott |
| 2008/0278957 A1 | 11/2008 | Pickard |
| 2008/0304260 A1 | 12/2008 | Van de Ven |
| 2008/0304261 A1 | 12/2008 | Van de Ven |
| 2008/0304269 A1 | 12/2008 | Pickard |
| 2008/0309255 A1 | 12/2008 | Myers et al. |
| 2009/0015759 A1 | 1/2009 | Honbo |
| 2009/0034283 A1 | 2/2009 | Albright et al. |
| 2009/0039791 A1 | 2/2009 | Jones |
| 2009/0046464 A1 | 2/2009 | Liu et al. |
| 2009/0059582 A1 | 3/2009 | Kulkarni |
| 2009/0079355 A1 | 3/2009 | Zhou et al. |
| 2009/0079357 A1 | 3/2009 | Shteynberg et al. |
| 2009/0079358 A1 | 3/2009 | Shteynberg et al. |
| 2009/0079359 A1 | 3/2009 | Shteynberg et al. |

(56) References Cited

U.S. PATENT DOCUMENTS

| | | |
|---|---|---|
| 2009/0079360 A1 | 3/2009 | Shteynberg et al. |
| 2009/0079362 A1 | 3/2009 | Shteynberg et al. |
| 2009/0086474 A1 | 4/2009 | Chou |
| 2009/0094000 A1 | 4/2009 | Krishnamurthy et al. |
| 2009/0101930 A1 | 4/2009 | Li |
| 2009/0108269 A1 | 4/2009 | Negley |
| 2009/0108281 A1 | 4/2009 | Keller et al. |
| 2009/0140630 A1 | 6/2009 | Kijima et al. |
| 2009/0147517 A1 | 6/2009 | Li et al. |
| 2009/0160363 A1 | 6/2009 | Negley et al. |
| 2009/0161356 A1 | 6/2009 | Negley |
| 2009/0170226 A1 | 7/2009 | Wall, Jr. |
| 2009/0184616 A1 | 7/2009 | Van De Ven et al. |
| 2009/0184662 A1 | 7/2009 | Given et al. |
| 2009/0184666 A1 | 7/2009 | Myers |
| 2009/0189529 A1 | 7/2009 | Negley et al. |
| 2009/0195168 A1 | 8/2009 | Greenfeld |
| 2009/0251934 A1 | 10/2009 | Shteynberg et al. |
| 2009/0284172 A1 | 11/2009 | Maschietto et al. |
| 2009/0296384 A1 | 12/2009 | Van de Ven et al. |
| 2010/0002440 A1 | 1/2010 | Negley et al. |
| 2010/0026187 A1 | 2/2010 | Kelly et al. |
| 2010/0026208 A1 | 2/2010 | Shteynberg et al. |
| 2010/0027258 A1 | 2/2010 | Maxik et al. |
| 2010/0045187 A1 | 2/2010 | Shteynberg et al. |
| 2010/0045210 A1 | 2/2010 | Hariharan |
| 2010/0060130 A1 | 3/2010 | Li |
| 2010/0060175 A1 | 3/2010 | Lethellier |
| 2010/0060181 A1 | 3/2010 | Choi et al. |
| 2010/0067227 A1 | 3/2010 | Budike |
| 2010/0072902 A1 | 3/2010 | Wendt et al. |
| 2010/0079059 A1 | 4/2010 | Roberts et al. |
| 2010/0079076 A1 | 4/2010 | Chang et al. |
| 2010/0079262 A1 | 4/2010 | Van Laanen |
| 2010/0090604 A1 | 4/2010 | Maruyama et al. |
| 2010/0102119 A1 | 4/2010 | Gustin et al. |
| 2010/0102199 A1 | 4/2010 | Negley |
| 2010/0102697 A1 | 4/2010 | Van de Ven |
| 2010/0103660 A1 | 4/2010 | van de Ven et al. |
| 2010/0103678 A1 | 4/2010 | Van de Ven |
| 2010/0109537 A1 | 5/2010 | Nishino et al. |
| 2010/0109557 A1 | 5/2010 | Bouchard |
| 2010/0109560 A1 | 5/2010 | Yu et al. |
| 2010/0109564 A1* | 5/2010 | Shin ............ H05B 33/0857 315/294 |
| 2010/0109570 A1 | 5/2010 | Weaver |
| 2010/0123403 A1 | 5/2010 | Reed |
| 2010/0127282 A1 | 5/2010 | Harbers et al. |
| 2010/0127283 A1 | 5/2010 | van de Ven et al. |
| 2010/0134018 A1 | 6/2010 | Tziony et al. |
| 2010/0135016 A1 | 6/2010 | Ishibashi |
| 2010/0141159 A1 | 6/2010 | Shiu et al. |
| 2010/0156763 A1* | 6/2010 | Lee et al. ............ 345/76 |
| 2010/0177509 A1 | 7/2010 | Pickard |
| 2010/0194274 A1 | 8/2010 | Hoogzaad |
| 2010/0207150 A1 | 8/2010 | Grajcar |
| 2010/0213859 A1 | 8/2010 | Shteynberg et al. |
| 2010/0225220 A1 | 9/2010 | Tanaka et al. |
| 2010/0225251 A1 | 9/2010 | Maruyama |
| 2010/0231135 A1* | 9/2010 | Hum ............ H05B 33/083 315/250 |
| 2010/0246177 A1 | 9/2010 | Van de Ven |
| 2010/0246197 A1 | 9/2010 | Takahashi et al. |
| 2010/0252851 A1 | 10/2010 | Emerson et al. |
| 2010/0259182 A1 | 10/2010 | Man et al. |
| 2010/0264832 A1 | 10/2010 | Archenhold et al. |
| 2010/0277084 A1 | 11/2010 | Lee et al. |
| 2010/0308738 A1 | 12/2010 | Shteynberg et al. |
| 2010/0308739 A1 | 12/2010 | Shteynberg et al. |
| 2010/0315016 A1 | 12/2010 | Hoogzaad |
| 2010/0327746 A1 | 12/2010 | Hisayasu |
| 2011/0025217 A1 | 2/2011 | Zhan et al. |
| 2011/0031894 A1 | 2/2011 | Van de Ven |
| 2011/0037413 A1 | 2/2011 | Negley et al. |
| 2011/0068696 A1 | 3/2011 | van de Ven et al. |
| 2011/0068701 A1 | 3/2011 | van de Ven et al. |
| 2011/0068702 A1 | 3/2011 | van de Ven et al. |
| 2011/0074265 A1 | 3/2011 | Van de Ven |
| 2011/0074289 A1 | 3/2011 | Van de Ven |
| 2011/0075411 A1 | 3/2011 | Van de Ven et al. |
| 2011/0075414 A1 | 3/2011 | Van de Ven et al. |
| 2011/0075422 A1 | 3/2011 | Van de Ven et al. |
| 2011/0075423 A1 | 3/2011 | Van de Ven |
| 2011/0084614 A1 | 4/2011 | Eisele et al. |
| 2011/0101883 A1 | 5/2011 | Grajcar |
| 2011/0109228 A1 | 5/2011 | Shimomura et al. |
| 2011/0109244 A1 | 5/2011 | Grajcar |
| 2011/0115394 A1 | 5/2011 | Shteynberg et al. |
| 2011/0115411 A1 | 5/2011 | Shteynberg et al. |
| 2011/0121754 A1 | 5/2011 | Shteynberg et al. |
| 2011/0148314 A1 | 6/2011 | Lin et al. |
| 2011/0169417 A1 | 7/2011 | Hum et al. |
| 2011/0180818 A1 | 7/2011 | Lerman et al. |
| 2011/0181194 A1 | 7/2011 | Hum et al. |
| 2011/0193467 A1 | 8/2011 | Grajcar |
| 2011/0198984 A1 | 8/2011 | Van de Ven |
| 2011/0199003 A1 | 8/2011 | Muguruma et al. |
| 2011/0210678 A1 | 9/2011 | Grajcar |
| 2011/0211351 A1 | 9/2011 | Van de Ven |
| 2011/0227484 A1 | 9/2011 | Huynh |
| 2011/0227485 A1 | 9/2011 | Huynh |
| 2011/0227489 A1 | 9/2011 | Huynh |
| 2011/0227490 A1 | 9/2011 | Huynh |
| 2011/0273102 A1 | 11/2011 | van de Ven et al. |
| 2011/0309760 A1 | 12/2011 | Beland et al. |
| 2012/0091920 A1 | 4/2012 | Yang |
| 2012/0099321 A1 | 4/2012 | Scott et al. |
| 2012/0176826 A1 | 7/2012 | Lazar |
| 2012/0193649 A1 | 8/2012 | Donofrio et al. |
| 2012/0193661 A1 | 8/2012 | Emerson et al. |
| 2012/0193662 A1 | 8/2012 | Donofrio et al. |
| 2012/0194073 A1 | 8/2012 | Wang et al. |
| 2012/0313545 A1 | 12/2012 | Courtel |
| 2013/0278157 A1 | 10/2013 | Radermacher |

FOREIGN PATENT DOCUMENTS

| | | |
|---|---|---|
| CN | 101137261 A | 3/2008 |
| CN | 101227780 A | 7/2008 |
| CN | 101529983 A | 9/2009 |
| CN | 101668373 A | 3/2010 |
| CN | 101772245 A | 7/2010 |
| CN | 101827481 A | 9/2010 |
| CN | 101994932 A | 3/2011 |
| CN | 201758472 U | 3/2011 |
| CN | 102804926 A | 11/2012 |
| EP | 1 020 935 A2 | 7/2000 |
| EP | 1 594 348 A2 | 11/2005 |
| EP | 1 881 259 A1 | 1/2008 |
| JP | 59-113768 A | 6/1984 |
| JP | 4 196359 A | 7/1992 |
| JP | 3412702 B2 | 6/2003 |
| JP | 2003-273404 A | 9/2003 |
| JP | 2005-310997 A | 11/2005 |
| JP | 2010527459 A | 12/2005 |
| JP | 2006-103404 A | 4/2006 |
| JP | 2006-332022 A | 12/2006 |
| JP | 2008-059811 A | 3/2008 |
| JP | 2008-125339 A | 5/2008 |
| JP | 2008-205357 A | 9/2008 |
| JP | 2008-544569 A | 12/2008 |
| JP | 2009-016280 A | 1/2009 |
| JP | 2009-049010 A | 3/2009 |
| JP | 2010-092776 A | 4/2010 |
| KR | 10-2010-0040242 | 4/2010 |
| TW | 512575 | 12/2002 |
| TW | 200705714 | 2/2007 |
| TW | I294256 | 3/2008 |
| TW | I411122 B | 10/2013 |
| WO | WO 03/096761 | 11/2003 |
| WO | WO 2006/007388 A1 | 1/2006 |
| WO | WO 2006/018604 A1 | 2/2006 |
| WO | WO 2007/023454 A1 | 3/2007 |
| WO | WO 2008/036873 | 3/2008 |

(56) References Cited

FOREIGN PATENT DOCUMENTS

| WO | WO 2008/051957 | 5/2008 |
|---|---|---|
| WO | WO 2008/061082 | 5/2008 |
| WO | WO2008/129504 | 10/2008 |
| WO | WO 2010/012999 A2 | 2/2010 |
| WO | WO 2012/005771 A2 | 1/2012 |

OTHER PUBLICATIONS

U.S. Appl. No. 12/328,115, filed Dec. 4, 2008, Chobot.
U.S. Appl. No. 11/854,744, filed Sep. 13, 2007, Myers.
U.S. Appl. No. 60/844,325, filed Sep. 13, 2006, Myers.
European Search Report Corresponding to European Patent Application No. EP 10 81 9249; Dated: Mar. 27, 2014; 8 Pages.
EXM020, Multi-Channel 160W LED Driver, Rev. 2.0 Nov. 2010, 13 pages, www.exclara.com.
EXM055, 14.8W Dimmable LED Ballast, Rev. 0.7, Mar. 11, 2011, 10 pages, www.exclara.com.
EXM057, 14.5W Dimmable LED Ballast, Rev. 0.5, Mar. 11, 2011, 8 pages, www.exclara.com.
International Preliminary Report Corresponding to International Application No. PCT/US2011/033736; Date of Mailing: Nov. 22, 2012; 8 Pages.
International Preliminary Report on Patentability corresponding to International Application No. PCT/US2010/029897; Date of Mailing: Apr. 27, 2011; 14 pages.
International Preliminary Report on Patentability Corresponding to International Application No. PCT/US2012/040189; Date of Mailing: Dec. 19, 2013, 13 Pages.
International Search Report and Written Opinion, PCT/US2010/048567, Oct. 29, 2010.
International Search Report Corresponding to International Application No. PCT/US2012/047344; Date of Mailing: Dec. 3, 2012; 16 Pages.
International Search Report Corresponding to International Application No. PCT/US2012/054384; Date of Mailing: Nov. 26, 2012; 13 Pages.
International Search Report Corresponding to International Application No. PCT/US12/54869; Date of Mailing: Nov. 23, 2012; 10 Pages.
International Search Report Corresponding to International Application No. PCT/US12/54888; Date of Mailing: Nov. 23, 2012; 12 Pages.
International Search Report Corresponding to PCT/US12/47643; Date of Mailing: Oct. 25, 2012; 10 Pages.
Japanese Office Action Corresponding to Japanese Patent Application No. 2013-509109; Dispatch date: Sep. 17, 2013; Foreign Text, 2 Pages, English Translation Thereof, 3 Pages.
Notification of transmittal of the international search report and the written opinion of the international searching authority, or declaration, PCT/US2010/029897, Jun. 23, 2010.
"ASSIST Recommends . . . LED Life for General Lighting: Definition of Life", vol. 1, Issue 1, Feb. 2005.
"Bright Tomorrow Lighting Competition (L Prize™)", May 28, 2008, Document No. 08NT006643.
"ENERGY STAR® Program Requirements for Solid State Lighting Luminaires, Eligibility Criteria—Version 1.1", Final: Dec. 19, 2008.
Acriche, Technical Data Sheet, "Designing with Acrich 2", Aug. 2011, www.Acrich.com, 1 page.
Application Note: CLD-AP06.006, entitled Cree® XLamp® XR Family & 4550 LED Reliability, published at cree.com/xlamp, Sep. 2008.
Cree, "XLamp XT-E LEDs, leading the revolution in LED lighting", Retrieved from the internet on Feb. 28, 2012 at URL: http://www.cree.com/led-components-and-modules/products/xlamp/discrete-nondirectional/xlamp-xte-hvw, 3 pages.
DuPont "DuPont™ Diffuse Light Reflector", Publication K-20044, May 2008, 2 pages.
Furukawa Electric Co., Ltd., Data Sheet, "New Material for Illuminated Panels Microcellular Reflective Sheet MCPET", updated Apr. 8, 2008, 2 pages.
Global Patent Literature Text Search Corresponding to PCT Application No. PCT/US2011/38995; Date of Search: Sep. 8, 2011; 7 pages.
Illuminating Engineering Society Standard LM-80-08, entitled "IES Approved Method for Measuring Lumen Maintenance of LED Light Sources", Sep. 22, 2008, ISBN No. 978-0-87995-227-3.
International Preliminary Report on Patentability Corresponding to International Application No. PCT/US2011/038995; Date of Mailing: Dec. 20, 2012; 7 Pages.
International Preliminary Report on Patentability Corresponding to International Application No. PCT/US2012/054888; Date of Mailing: Mar. 27, 2014; 10 Pages.
International Preliminary Report on Patentability Corresponding to International Application No. PCT/US2012/054869; Date of Mailing: Mar. 27, 2014; 8 Pages.
International Preliminary Report on Patentability Corresponding to International Application No. PCT/US2010/048225; Date of Mailing: Feb. 27, 2014; 9 Pages.
International Preliminary Report on Patentability Corresponding to International Application No. PCT/US2010/048567; Date of Mailing: Apr. 5, 2012; 10 pages.
International Preliminary Report on Patentability Corresponding to International Application No. PCT/US2012/047643; Date of Mailing: Feb. 6, 2014; 8 Pages.
International Preliminary Report on Patentability Corresponding to International Application No. PCT/US2012/054384; Date of Mailing: Mar. 27, 2014; 11 Pages.
International Preliminary Report on Patentability Corresponding to International Application No. PCT/US2012/054869, Date of Mailing: Mar. 27, 2014, 8 pages.
International Search Report and The Written Opinion Corresponding to International Application No. PCT/US2011/038995; Date of Mailing: Sep. 16, 2011; 9 pages.
International Search Report and the Written Opinion Corresponding to International Application No. PCT/US2010/048225; Dated: Nov. 4, 2010; 11 pages.
International Search Report and the Written Opinion of the International Searching Authority, or the Declaration, PCT/US12/54888, Date of Mailing: Nov. 23, 2012.
International Search Report and Written Opinion Corresponding to International Application No. PCT/US2012/047344; Date of Mailing: Dec. 3, 2012; 16 Pages.
International Search Report and Written Opinion Corresponding to International Application No. PCT/US2010/048567; Date of Mailing: Oct. 29, 2010; 12 Pages.
International Search Report Corresponding to International Application No. PCT/US2011/033736; Date of Mailing: Jul. 7, 2011; 10 Pages.
Kim et al. "Strongly Enhanced Phosphor Efficiency in GaInN White Light-Emitting Diodes Using Remote Phosphor Configuration and Diffuse Reflector Cup" Japanese Journal of Applied Physics 44(21):L649-L651 (2005).
LEDs Magazine, Press Release May 23, 2007, "Furukawa America Debuts MCPET Reflective Sheets to Improve Clarity, Efficiency of Lighting Fixtures", downloaded Jun. 25, 2009 from http://www.ledsmagazine.com/press/15145, 2 pages.
Lighting Research Center, Rensselaer Polytechnic Institute, "What is color consistency?" NLPIP, vol. 8, Issue 1, Oct. 2004. Retrieved from the internet: http://www.Lrc.rpi.edu/programs/nlpip/lightinganswers/lightsources/whatisColorConsistency.asp.
MCPET—Microcellular Reflective Sheet Properties, http://www.trocellen.com, downloaded Jun. 25, 2009, 2 pages.
Philips Lumileds, Technology White Paper: "Understanding power LED lifetime analysis", downloaded from http://www.philipslumileds.com/pdfs/WP12.pdf, Document No. WP12, Last Modified May 22, 2007.

(56) References Cited

OTHER PUBLICATIONS

Sutardja, P., "Design for High Quality and Low Cost SSL with Power Factor Correction", Marvell Semiconductor Inc. Jul. 2011. 16 pages.
Yung, Winco K.C., "Using Metal Core Printed Circuit Board (MCPCB) as a Solution for Thermal Management", *Journal of the HKPCA*, Issue No. 24, 2007, 5 pages.
Chinese Office Action Corresponding to Chinese Patent Application No. 201280044038.8; Date of Notification: Dec. 12, 2014; Foreign Text, 16 Pages, English Translation Thereof, 7 Pages.
Chinese First Office Action Corresponding to Chinese Application No. 201180004266.8; Date of Issuance: Nov. 3, 2014; Foreign Text, 7 Pages, English Translation Thereof, 4 Pages.
Chinese First Office Action Corresponding to Chinese Application No. 201280052473.5; Date of Notification: Jan. 4, 2015; 14 Pages.
Chinese Second Office Action Corresponding to Chinese Patent Application No. 201080053889; Date of Issue: Dec. 17, 2014; Foreign Text, 9 Pages, English Translation Thereof, 15 Pages.
Taiwanese Office Action Corresponding to Application No. 101131404; Dated: Nov. 19, 2015; Foreign Text Only, 15 pages.
Korean Preliminary Rejection Corresponding to Application 10-2012-7029011; Issued Date: Nov. 19, 2015; Foreign Text, 6 pages, English Translation Thereof, 5 pages.
Bergquist Company, "T-Clad Overview, Thermal Substrates", http://www.bergquistcompany.com/thermal_substrates/t-clad-product-overview.htm, 3 pages; downloaded Feb. 28, 2012.
Bulborama, Lighting Terms Reference and Glossary, http://www.bulborama.com/store/lightingreferenceglossary-13.html, 6 pages; downloaded May 13, 2010.
Lumitech, "Chip on Board (COB) LED Module", http://www.lumitech.bnet.at/chip-on-board-cob-led-module_11.htm, 2 pages; downloaded Dec. 28, 2011.
European Search Report Corresponding to Patent Application No. 12 83 2595; Dated: Oct. 7, 2015; 6 Pages.
Chinese Office Action and Search Report Corresponding to Chinese Patent Application No. 201280044036.9; Date of Notification: Dec. 3, 2015; Foreign Text, 13 Pages, English Translation Thereof, 9 Pages.
Korean Notice of Preliminary Rejection Corresponding to Korean Application No. 10-2012-7029011; Dated: May 10, 2016; Foreign Text, 6 Pages, English Translation Thereof, 5 Pages.

\* cited by examiner

SOLID STATE LIGHTING APPARATUS AND METHODS USING INTEGRATED DRIVER CIRCUITRY

CROSS-REFERENCE TO RELATED PATENT APPLICATIONS

The present application is a continuation of U.S. patent application Ser. No. 13/192,755, filed Jul. 28, 2011 entitled SOLID STATE LIGHTING APPARATUS AND METHODS USING INTEGRATED DRIVER CIRCUITRY, the disclosure of which is hereby incorporated by reference in its entirety.

FIELD

The present inventive subject matter relates to lighting apparatus and methods and, more particularly, to solid state lighting apparatus and methods.

BACKGROUND

Solid state lighting arrays are used for a number of lighting applications. For example, solid state lighting panels including arrays of solid state light emitting devices have been used as direct illumination sources, for example, in architectural and/or accent lighting. A solid state light emitting device may include, for example, a packaged light emitting device including one or more light emitting diodes (LEDs), which may include inorganic LEDs, which may include semiconductor layers forming p-n junctions and/or organic LEDs (OLEDs), which may include organic light emission layers.

Solid state lighting arrays are used for a number of lighting applications. For example, solid state lighting panels including arrays of solid state light emitting devices have been used as direct illumination sources, for example, in architectural and/or accent lighting. A solid state light emitting device may include, for example, a packaged light emitting device including one or more light emitting diodes (LEDs). Inorganic LEDs typically include semiconductor layers forming p-n junctions. Organic LEDs (OLEDs), which include organic light emission layers, are another type of solid state light emitting device. Typically, a solid state light emitting device generates light through the recombination of electronic carriers, i.e. electrons and holes, in a light emitting layer or region.

Solid state lighting panels are commonly used as backlights for small liquid crystal display (LCD) screens, such as LCD display screens used in portable electronic devices. In addition, there has been increased interest in the use of solid state lighting panels as backlights for larger displays, such as LCD television displays.

Although solid state light sources having high coloring rendering index (CRI) and/or high efficiency have been demonstrated, one problem with the large-scale adoption of such light sources in architectural applications is that commercial lighting systems utilize lamps with standardized connectors that are designed to be used with alternating current (AC) power, which may be phase cut using a phase cutting dimmer device. Typically, a solid state lighting source is provided or coupled with a power converter that converts AC power into DC power, and the DC power is used to energize the light source. However, the use of such power converters may increase the cost of the lighting source and/or the overall installation, and may reduce efficiency.

Some attempts at providing solid state lighting sources have involved driving an LED or string or group of LEDs using a rectified AC waveform. However, because the LEDs require a minimum forward voltage to turn on, the LEDs may turn on for only a part of the rectified AC waveform, which may result in visible flickering, may undesirably lower the power factor of the system, and/or may increase resistive loss in the system.

Other attempts at providing AC-driven solid state lighting sources have involved placing LEDs in an anti-parallel configuration, so that half of the LEDs are driven on each half-cycle of an AC waveform. However, this approach requires twice as many LEDs to produce the same luminous flux as using a rectified AC signal.

SUMMARY

Some embodiments provide a lighting apparatus including a first substrate including a switching circuit, the switching circuit including a first port, a second port and a current control circuit configured to generate a current at the second port of the current control circuit responsive to a varying voltage at the first port. The apparatus further includes a second substrate mounted on the first substrate and including at least two LEDs electrically coupled to the second port of the current control circuit of the first substrate.

In some embodiments, the at least two LEDs may include first and second end nodes coupled to the second port and the switching circuit may include respective terminals coupled to respective intermediate nodes of the at least two LEDs. The switching circuit may be configured to selectively bypass at least one LED. The switching circuit may be configured to vary a number of conducting LEDs responsive to the varying voltage. For example, the switching circuit may be configured to increase the number of conducting LEDs responsive to an increasing magnitude of the varying voltage.

In some embodiments, the apparatus may further include a rectifier circuit coupled to the first port and the switching circuit may include a buffer circuit coupled to an output of the rectifier circuit, a resistor ladder circuit coupled to an output of the buffer circuit and a plurality of switches, respective ones of which have control inputs coupled to respective nodes of the resistor ladder circuit. The apparatus may further include a voltage-controlled current control circuit electrically coupled to the output of the rectifier circuit and to the second port.

In some embodiments, the second substrate may be flip chip bonded to the first substrate. The first substrate may include a silicon substrate, a gallium nitride substrate, a silicon carbide substrate or a graphene substrate. The at least two LEDs may be arrayed on a surface of the second substrate opposite the first substrate. In further embodiments, the switching circuit may be configured to change between parallel and serial connections of first and second LEDs responsive to the varying voltage.

Some embodiments provide a device including a submount configured to support an LED substrate, a switching circuit integrated in the submount and including a first port, a second port and a current control circuit configured to generate a current at the second port of the current control circuit responsive to an varying voltage at the first port and a plurality of contacts on the submount, coupled to the second port of the switching circuit and configured to mate with corresponding contacts of the LED substrate. The plurality of contacts may include contacts configured couple the second port of the current control circuit to at least one of the LEDs on the LED substrate and contacts configured to couple respective terminals of the switching circuit to at least one other of contact of the LEDs. The device may further include a voltage-controlled current control circuit electrically coupled to the output of the rectifier circuit and to the second port.

The submount may be configured to support flip chip bonding of the LED substrate thereto. The submount may include a silicon substrate, a gallium nitride substrate, a silicon carbide substrate or a graphene substrate.

In some embodiments, the switching circuit may be configured to vary a number of conducting LEDs responsive to the varying voltage. In further embodiments, the switching circuit may be configured to change between parallel and serial connections of first and second LEDs responsive to the varying voltage.

Further embodiments provide a lighting apparatus including at least two LEDs and a switching circuit integrated on a common substrate, the switching circuit including a first port configured to be coupled to an AC power source, a second port coupled to first and second end nodes of the at least two LEDs, a current control circuit configured to generate a current at the second port responsive to an varying voltage at the first port and a LED switching circuit coupled to intermediate nodes of the LED string and configured to selectively bypass LEDs in the string of LEDs.

In some embodiments, the switching circuit may be configured to vary a number of conducting LEDs of the at least two LEDs responsive to the varying voltage. In some embodiments, the switching circuit may be configured to change between parallel and serial connections of first and second LEDs responsive to the varying voltage.

In additional embodiments, a lighting apparatus includes a plurality of LEDs and a switching circuit coupled to the plurality of LEDs and to a power source having a varying voltage and configured to change between parallel and serial connections among the LEDs responsive to the varying voltage.

BRIEF DESCRIPTION OF THE DRAWINGS

The accompanying drawings, which are included to provide a further understanding of the inventive subject matter and are incorporated in and constitute a part of this application, illustrate certain embodiment(s) of the inventive subject matter. In the drawings.

DETAILED DESCRIPTION

Figure 1:
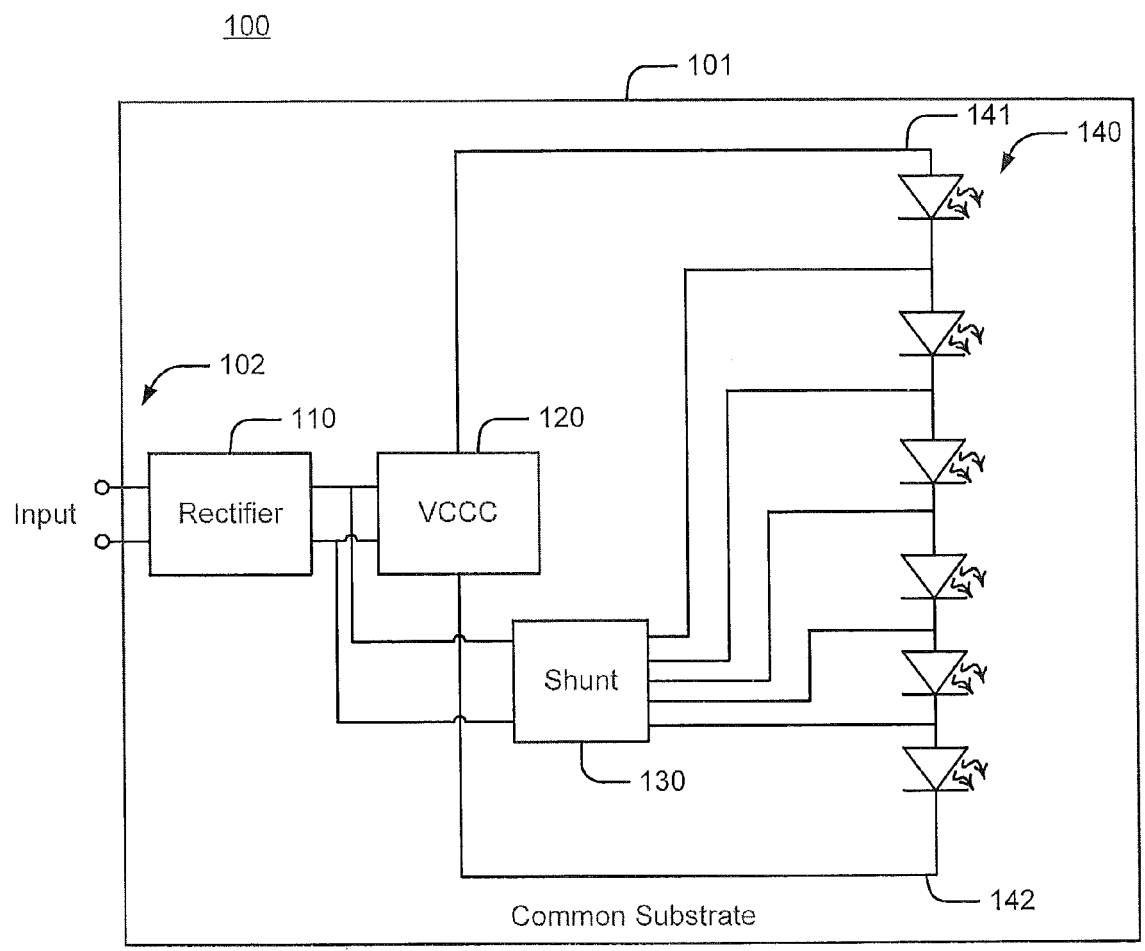
FIG. 1 illustrates a lighting apparatus according to some embodiments.

Embodiments of the present inventive subject matter now will be described more fully hereinafter with reference to the accompanying drawings, in which embodiments of the inventive subject matter are shown. This inventive subject matter may, however, be embodied in many different forms and should not be construed as limited to the embodiments set forth herein. Rather, these embodiments are provided so that this disclosure will be thorough and complete, and will fully convey the scope of the inventive subject matter to those skilled in the art. Like numbers refer to like elements throughout.

Embodiments of the present inventive subject matter now will be described more fully hereinafter with reference to the accompanying drawings, in which embodiments of the present inventive subject matter are shown. This present inventive subject matter may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the inventive subject matter are described herein with reference to plan and perspective illustrations that are schematic illustrations of idealized embodiments of the inventive subject matter. As such, variations from the shapes of the illustrations as a result, for example, of manufacturing techniques and/or tolerances, are to be expected. Thus, the inventive subject matter should not be construed as limited to the particular shapes of objects illustrated herein, but should include deviations in shapes that result, for example, from manufacturing. Thus, the objects illustrated in the figures are schematic in nature and their shapes are not intended to illustrate the actual shape of a region of a device and are not intended to limit the scope of the inventive subject matter.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

The expression "lighting apparatus", as used herein, is not limited, except that it indicates that the device is capable of emitting light. That is, a lighting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting, work lights, etc., mirrors/vanity lighting, or any other light emitting device.

The present inventive subject matter further relates to an illuminated enclosure (the volume of which can be illuminated uniformly or non-uniformly), comprising an enclosed space and at least one lighting apparatus according to the present inventive subject matter, wherein the lighting apparatus illuminates at least a portion of the enclosed space (uniformly or non-uniformly).

FIG. 1 illustrates a lighting apparatus 100 according to some embodiments. The apparatus 100 comprises a rectifier circuit 110, a voltage controlled current control (VCCC) circuit 120, a shunt circuit 130 and a string 140 of serially-connected light emitting diodes (LEDs), all of which are integrated on a common substrate 101. In embodiments described below, the common substrate 101 may comprise a variety of different types of structures, such as a printed circuit board (PCB) or a semiconductor substrate.

The rectifier circuit 110 is configured to generate a DC voltage from a power source coupled to an input 102. The power source may be an AC source, such as a utility source, or other source that generates a time-varying voltage, The VCCC circuit 120 is coupled to first and second end terminals 141, 142 of the LED string 140, and generates a current through the string 140 that is dependent upon the DC voltage generated by the rectifier circuit 110. For example, a phase cut signal, such as might be supplied by dimmer circuits commonly used in lighting applications, may be provided to the rectifier circuit 110. As the amount of phase cut varies, the VCCC circuit 120 will produce a correspondingly varying current through the LED string 140, thus causing the string 140 to brighten/darken in response to the phase cut signal. The VCCC circuit 120 may take any of a number of forms and may operate as a current source and/or a current sink for the string 140 of LEDs.

The shunt circuit 130 is connected to plural intermediate nodes of the LED string 140. The shunt circuit 130 may be used, for example, to provide power factor compensation by selectively bypassing LEDs in the string 140 responsive to the rectified voltage produced by the rectifier circuit 110. The shunt circuit 130 may use, for example, techniques described in commonly assigned U.S. patent application Ser. No. 12/775,842, entitled "AC Driver Solid State Lighting Apparatus with LED String Including Switched Segments," filed May 7, 2010 and incorporated herein by reference in its entirety. It will be appreciated that, although FIG. 2 illustrates a shunt-type LED circuit, other types of switching circuits for LED illumination control may be integrated with one or more LEDs on common substrate as illustrated in FIG. 1.

Figure 2:
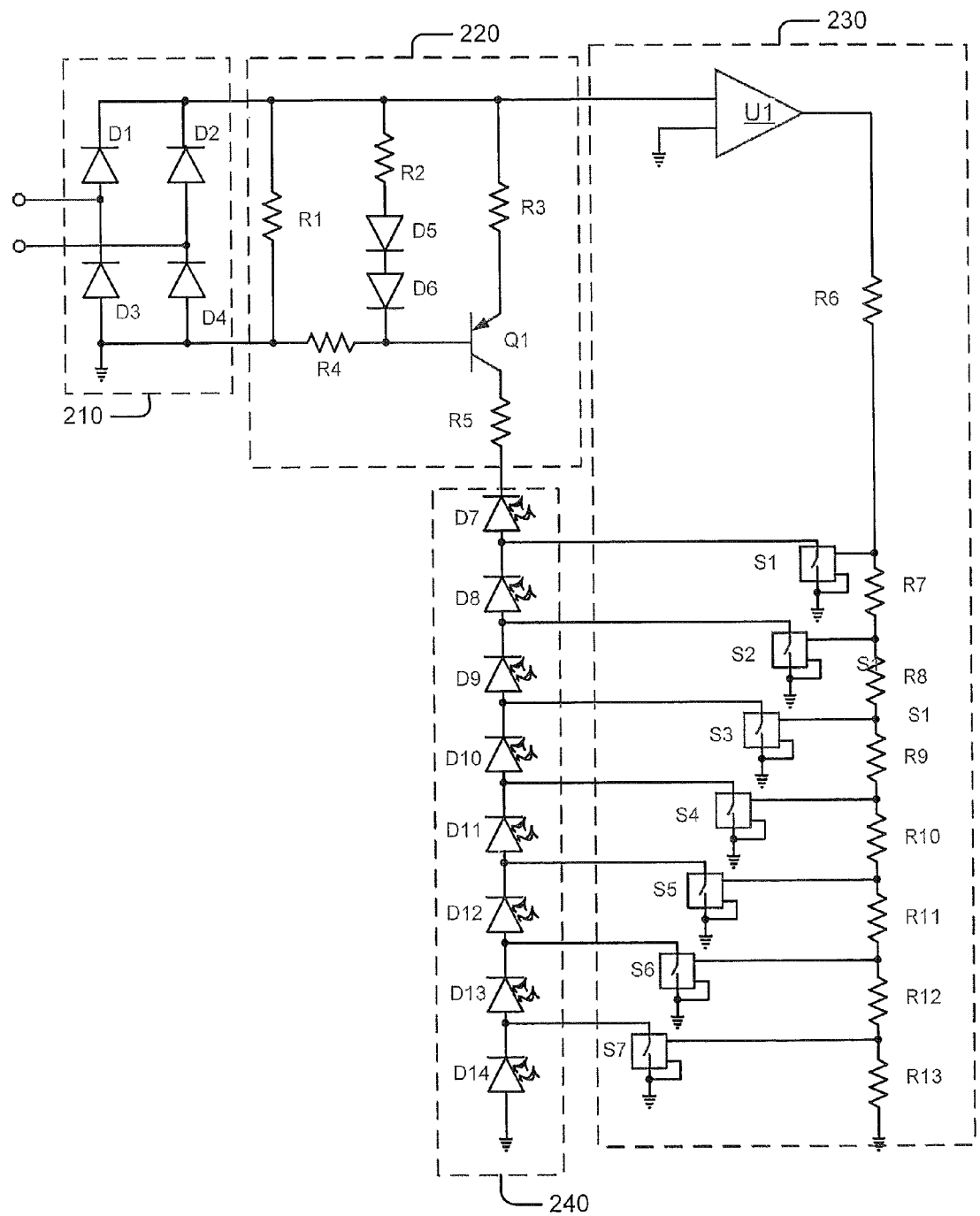
FIG. 2 illustrates drive circuitry for a lighting apparatus according to further embodiments.

FIG. 2 illustrates an exemplary circuit implementation of switching circuitry for use with an LED string 240 including serially connected LEDs D7-D14. The switching circuitry includes a rectifier circuit 210, a VCCC circuit 220 and a shunt circuit 230. As shown, the rectifier circuit 210 is a full-bridge diode rectifier including diodes D1-D4. The VCCC circuit 220 includes a bipolar transistor Q1 with a biasing network comprising resistors R1-R5 and diodes D5 and D6. The shunt circuit 230 comprises a plurality of switches S1-S7 that are coupled to respective nodes of the LED string 240. Control inputs of respective ones of the switches S1-S7 are coupled to a resistor ladder network comprising resistors R6-R13, which is driven by an amplifier U1 having an input coupled to the output of the rectifier circuit 210.

As will be appreciated, if the input voltage is a sinusoidal AC voltage, the output of the rectifier circuit 210 may be a full-wave rectified voltage having a waveform that includes a series of half-sinusoids repeating at twice the frequency of the input voltage. For the circuitry shown, as the magnitude of the input voltage increases in either the negative or positive voltage phase, switches S1-S7 successively open, causing the number of the LEDs D7-D14 coupled in series between the output of the VCCC circuit 220 and ground to incrementally increase as the voltage magnitude increases. This may constrain the current passing through the active LEDs to substantially conform to the input voltage waveform and, thus, may improve power factor.

It will appreciated that the circuitry shown n FIG. 2 is provided for purposes of illustration, and that other circuit implementations may be used in other embodiments. For example, the selective bypass functionality provided by the shunt circuit 230 may be provided using a variety of different circuits. For example, rather than selectively coupling nodes of the LED string 240 to ground as shown in FIG. 2, switches or other devices may be used to bypass current around selective ones of the LEDs D1-D7 using selective bypass circuitry along the lines described in U.S. patent application Ser. No. 12/704,730, entitled "Solid State Lighting Apparatus with Compensation Bypass Circuits and Methods of Operation Thereof," filed Feb. 12, 2010 and incorporated herein by reference in its entirety. Rather than using a resistor ladder as shown in FIG. 2, a shunt circuit may use a microprocessor or other digital circuitry to control bypass switching elements for an LED string. For example, a shift register clocked by a voltage comparator circuit may be used to drive a bank of bypass switches.

Circuitry along the lines of that shown in FIGS. 1 and 2 may also be configured to provide reduced perceptible flicker that may arise from dimming using a phase cut signal. For example, in some embodiments, a VCCC, such as the VCCC circuit 220 of FIG. 2, may be modified to provide a brief "off period" during each "on" portion of a phase cut waveform, thus providing a apparent higher frequency of operation of the LED string. The LEDs in the string may be disabled when the amount of phase cut reaches the point that there is insufficient "on" time to prevent perceptible flicker.

Figure 3:
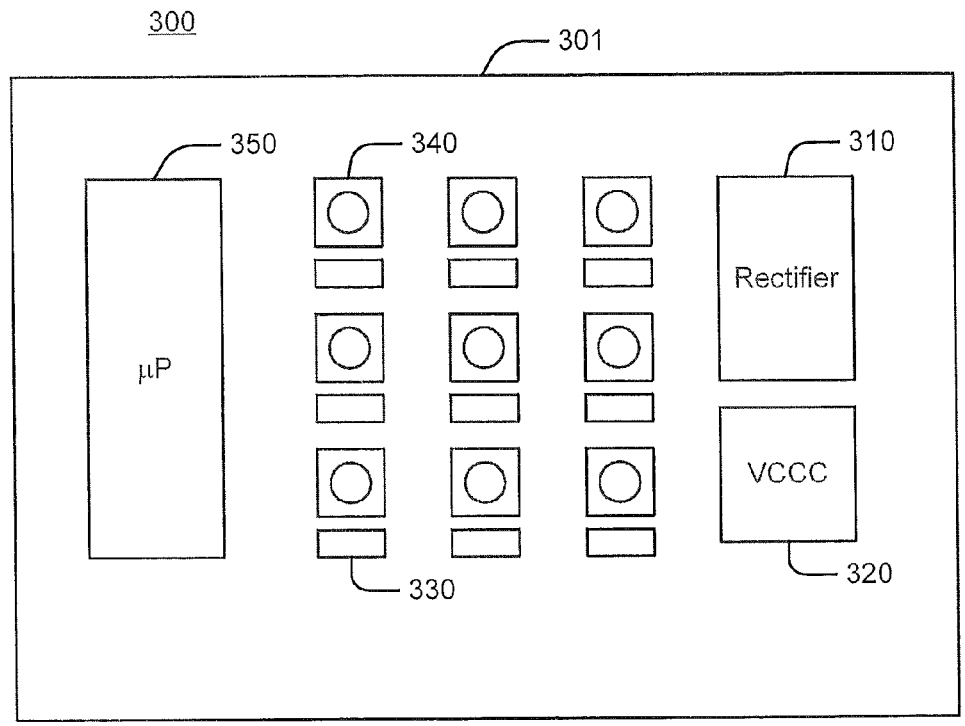
FIG. 3 illustrates a lighting apparatus with integrated drive circuitry according to some embodiments.

FIG. 3 illustrates an exemplary implementation of a lighting apparatus 300 according to some embodiments. The apparatus 300 may have a circuit configuration along the lines discussed above with reference to FIGS. 1 and 2, i.e., the apparatus 300 includes a rectifier circuit 310, a VCCC circuit 320 and shunt switches 330 supported by a PCB 301. The rectifier circuit 310 and/or the VCCC circuit 320 may comprise discrete components (e.g., discrete diodes, transistors and resistors) or may be implemented as integrated circuits configured for mounting on the PCB 301. An array of LEDs 340 are also mounted on the PCB 301, and connected to the VCCC circuit 320 and the shunt switches 330. The shunt switches 330 may be controlled by a microprocessor 350, also mounted on the PCB 301. The microprocessor 350 may be used for other functions, such as communications and control.

Figure 4:
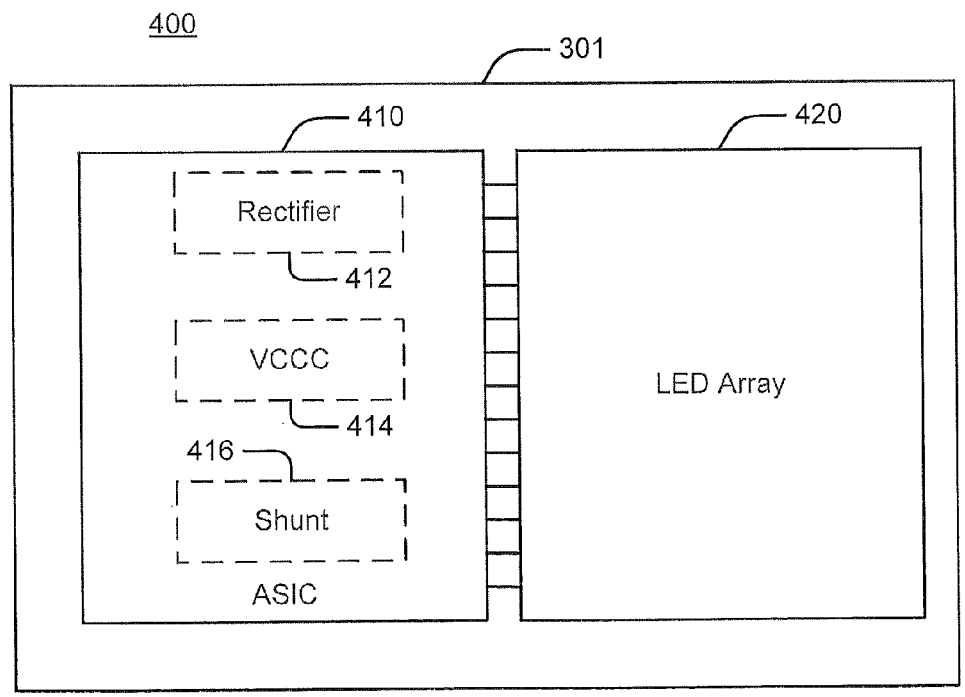
FIG. 4 illustrates a lighting apparatus with integrated drive circuitry according to further embodiments.

FIG. 4 illustrates an alternative configuration for a lighting apparatus 400 according to further embodiments. The apparatus 400 includes an application specific integrated circuit (ASIC) 410 in which at least some components of a rectifier circuit 412, a VCCC circuit 414 and a shunt circuit 416 are implemented. The ASIC 410 is connected to an integrated LED array 420, e.g., to terminal and intermediate nodes of a serially-connected string of LEDs implemented in the LED array 420. These circuits may provide functionality along the lines discussed above with reference to FIGS. 1 and 2. The ASIC 410 and LED array 420 may be mounted on a common microelectronic substrate 401.

According to additional embodiments, an LED array such as those discussed above with reference to FIGS. 3 and 4, may have characteristics tailored for use with switching circuits such as those described with reference to FIGS. 1 and 2. For example, when using an array of LEDs with a power-factor correcting switching circuitry along the lines of FIGS. 1 and 2, the number and/or size of the LEDs can be matched with the characteristics of the switching circuitry to achieve a desired current density in the LEDs.

According to further aspects, an LED array for use with such switching circuitry may include circuitry that allows the interconnections of LEDs in the array to be varied. For example, the LED array may include switching circuitry that allows LEDs to be selectively paralleled such that, for example, the number of LEDs driven in parallel increases as the current provided by the switching circuit increases. In this manner, for example, a desired current density in the LEDs may be maintained as dimming varies.

Interconnections among LEDs in the array may also be configurable using components, such as switches or fuses, that may be used to provide different terminal characteristics for different driving voltages. For example, blowing a first set of fuses may provide a 230V string, blowing a second set of fuses may provide a 120V string, and blowing a third set of fuses may provide a 100V string. In still further embodiments, when used with a power factor correcting switching circuit along the lines of that shown in FIG. 2, certain LEDs in a string tend to be "on" for a greater duration than others. For example, referring to FIG. 2, the LED D7 first turned "on" during the cycle of the rectified output of the rectifier circuit 210 is energized for a longer period than the LED D14 activated towards the peak of the rectified waveform. An LED array may be configured to allow periodic reconfiguration of the string of LEDs, such that the LEDs that are "on" for a greater portion of a cycle of a periodic input voltage (e.g., an AC voltage from an AC source) are rotated at a rate that provides equalization of the duty each LED experiences over an extended period of operation.

Figure 5A:
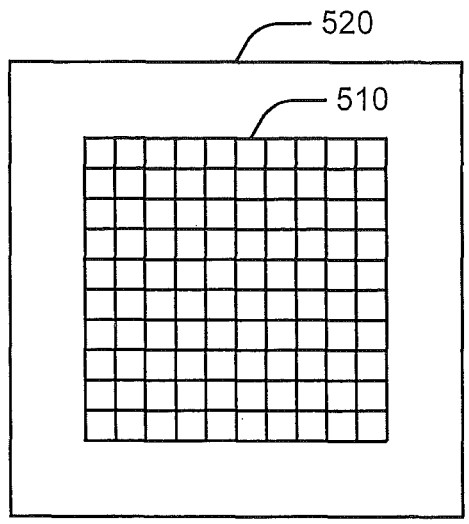
FIGS. 5A and 5B illustrate a lighting apparatus with a submount including integrated drive circuitry according to further embodiments.
Figure 5B:
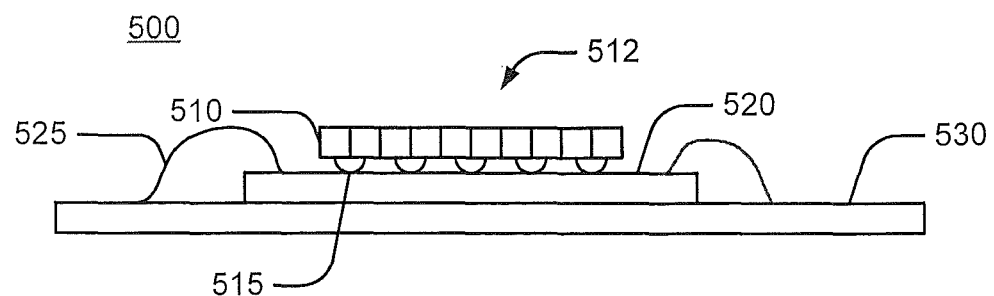

FIGS. 5A and 5B illustrate a lighting apparatus in the form of a module 500 with yet another alternative configuration. The module 500 includes an array of LEDs 512 disposed on a surface of a first substrate 510. The LED array substrate 510 is mounted on a second substrate 520 that serves as a submount in a flip-chip arrangement, such that the solder bumps 515 on a surface of the LED array substrate 510 opposite the LEDs 512 contact an upper surface of the submount substrate 520. LED switching circuitry, such as that described with reference to FIG. 2 above, may be disposed on and/or in the submount substrate 510. The LED drive circuitry is connected to the LEDs 512 in the LED array substrate 510 using the solder bumps 515, and the submount substrate 520 may be connected to an AC power supply via bonding wires 525 to contacts on an underlying PCB 530. The LEDs 512 in the LED substrate 510 may be internally connected to provide one or more strings of LEDs along the lines discussed above with reference to FIGS. 1 and 2. The LED substrate 510 may be directly disposed on and/or in the submount substrate 510 and/or intervening structures may be present, such as a heat transfer layer formed of graphene or graphite and/or a reflective layer that is used to produce directionality in the LED output.

According to some embodiments, the submount substrate 510 may comprise a silicon substrate. In some embodiments, the submount substrate 520 may be formed of other materials, such as gallium nitride (GaN), silicon carbide (SiC) and/or graphene. The submount substrate 510 may have features therein that enhance thermal transfer from the LED array substrate 520, such as thermal vias and/or a plated-on thermal enhancer to improve thermal conduction to an underlying thermal management structure, such as a heat sink or a metal core in the underlying PCB 530.

Figure 6:
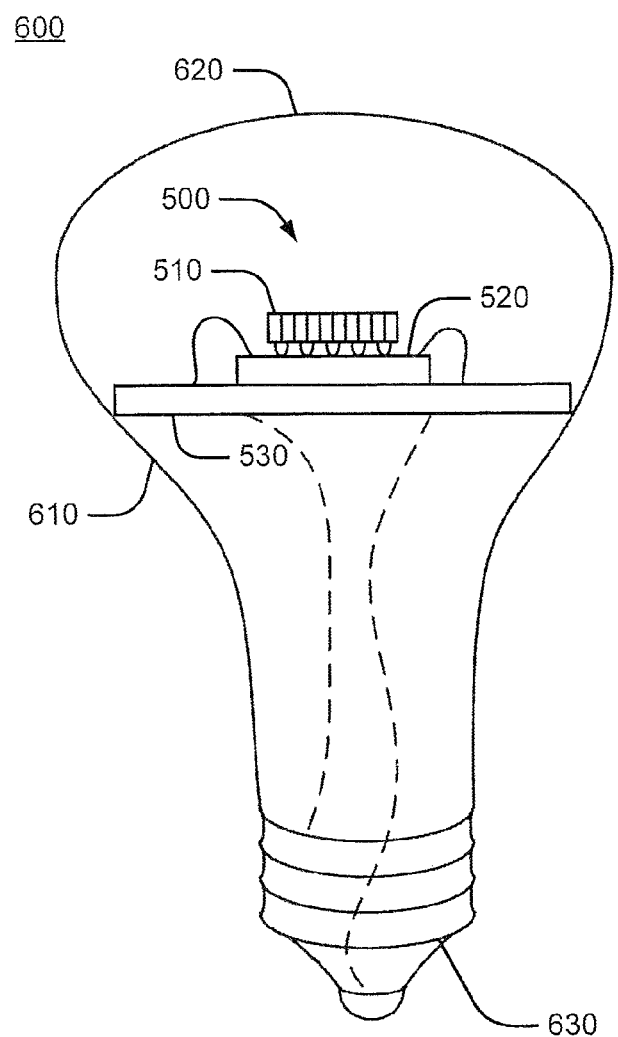
FIG. 6 illustrates a lamp device incorporating an LED with integrated drive circuitry according to further embodiments.

As illustrated in FIG. 6, an integrated lighting module having the form factors illustrated in FIGS. 3-5 or any of a variety of other form factors, may be mounted within a lighting apparatus, such as a lamp having a standardized AC power connector. For example, as shown in FIG. 6, a bulb-type lamp device may include a housing 610 with a translucent dome 620. The integrated lighting module may be applicable to any form factor or shape of a lamp device, including, but not limited to bulb-type and tube-type devices. An integrated lighting module 500 (or multiple ones of such modules) along the lines illustrated in FIGS. 5A and 5B may be mounted within the housing 610, with a varying-voltage power (e.g., AC power) provided to the assembly via, for example, a conventional Edison screw-type lamp base 630. In this manner, the lighting assembly 500 may functionally replace the filament of a conventional lamp by providing an integrated assembly that simply requires an AC power input, which may be a normal AC power input or a phase cut AC power input from a dimming device. It will be appreciated that other components, such as thermal structures for conducting heat away from the assembly 500, may also be included in the device 600. It will be understood that various types of different AC power connections may be used, including, but not limited to, screw bases and pin and socket connections. Although the connection between the lamp base 630 and the lighting module 500 may be wired, it will be appreciated that other arrangements may be used. For example, in some lighting apparatus, a lighting module, such as the module 500, may include an integrated AC connector configured to directly mate with a lighting socket or other AC connector. For example, a lighting module along the lines discussed above may include an integral set of contacts or other connector structure that is configured to mate with a matching AC power connector.

Figure 7:
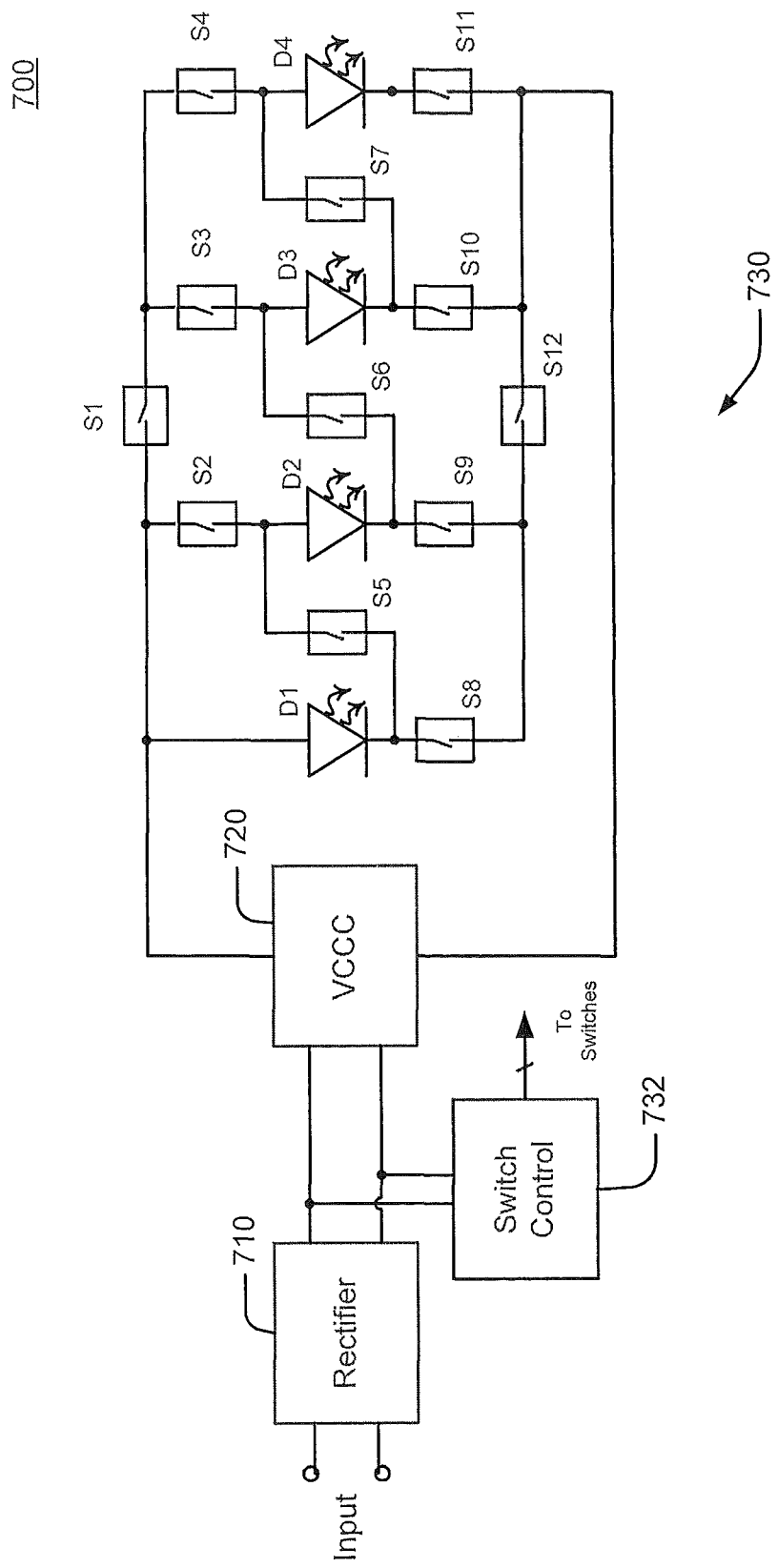
FIGS. 7-10 illustrate drive circuitry and operations thereof for a lighting apparatus according to still further embodiments.

According to further embodiments, a lighting apparatus may utilize switching circuit that can dynamically change serial and parallel connections among LEDs responsive to a varying voltage waveform, such as an AC power input. FIG. 7 illustrates a lighting apparatus 700 including a rectifier circuit 110, a voltage controlled current control (VCCC) circuit 120 and a switching circuit 730 comprising a plurality of switches S1, S2, ..., S11 that, under control of a switch control circuit 732, variably interconnect a plurality of LEDs D1, D2, D3, D4. Along lines described above, the LEDs D1, D2, D3, D4, the rectifier 710, the VCCC 720 and/or the switching circuit 730 may be integrated on a common substrate. In some embodiments, the LEDs D1, D2, D3, D4 may be implemented on a one substrate, and the other control circuitry (e.g., the rectifier 710, VCCC 720 and switching circuit 730) may be implemented in a submount substrate configured to interface with the LED substrate. It will be appreciated that other arrangements may be used, such as ones in which the LEDs D1, D2, D3, D4 and portions of the switching circuit 730, such as the switches S1, S2, ..., S11, are combined on a single substrate.

Figure 8:
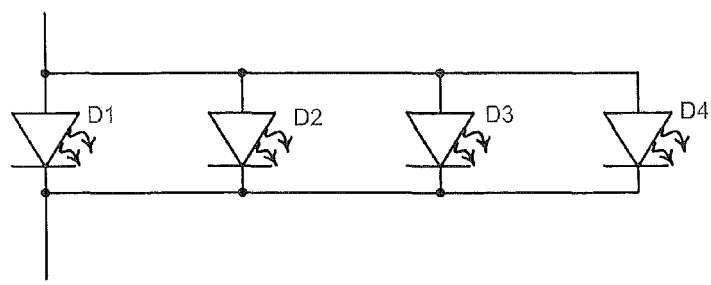
Figure 9:
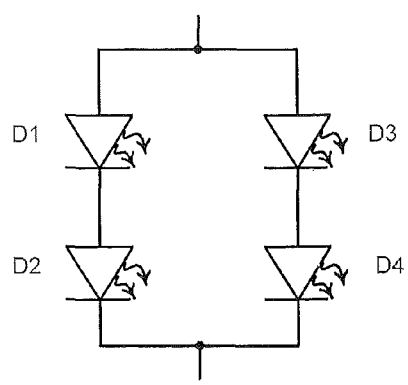
Figure 10:
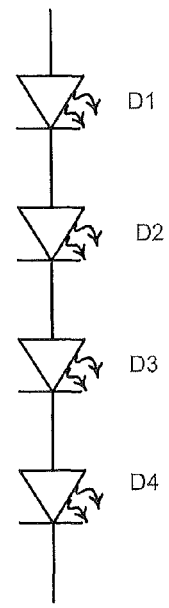

The switch control circuit 732 may be configured to vary parallel and serial interconnections among the LEDs D1, D2, D3, D4 responsive to a varying voltage. For example, if the input to the rectifier 710 is an AC voltage, the output of the rectifier 710 may be a full-wave rectified voltage. Referring to FIGS. 8-10, as the rectified voltage increases in magnitude, the switch control circuit 732 may implement a sequence in which the switches S1, S2, ..., S11 are selectively operated to change from a first state in which the LEDs D1, D2, D3, D4 are connected in parallel (FIG. 8), to a second state in which series-connected pairs of the LEDs D1, D2, D3, D4 are connected in parallel (FIG. 9) and to a third state in which the LEDs D1, D2, D3, D4 are connected in series (FIG. 10). It will be appreciated that this sequence may be reversed as the magnitude of the rectified voltage decreases. In this manner, the number of conducting LEDs may be maintained substantially constant as the rectified voltage changes. It will be appreciated that the sequence of circuit configurations illustrated in FIGS. 8-10 are provided for purposes of illustration, and that other sequences may be used.

In the drawings and specification, there have been disclosed typical preferred embodiments of the inventive subject matter and, although specific terms are employed, they are used in a generic and descriptive sense only and not for purposes of limitation, the scope of the inventive subject matter being set forth in the following claims.

What is claimed is:

1. A lighting apparatus comprising:
a first substrate comprising a switching circuit; and
a second substrate mechanically attached to the first substrate and comprising at least two light emitting diodes (LEDs) interfaced with the switching circuit, the switching circuit being configured to vary interconnections among the at least two LEDs responsive to a varying voltage produced by a power source to provide a plurality of different parallel and serial arrangements of the at least two LEDs including an arrangement wherein at least two parallel interconnected subsets of the at least two LEDs are connected in series with each other.

2. The apparatus of claim 1, wherein the at least two LEDs have first and second nodes coupled to the power source and at least one third node coupled to the at least one terminal of the switching circuit.

3. The apparatus of claim 2, wherein the switching circuit is configured to selectively bypass at least one LED of the at least two LEDs responsive to the varying voltage produced by the power source.

4. The apparatus of claim 3, wherein the varying voltage comprises an AC voltage.

5. The apparatus of claim 2, wherein the at least two LEDs comprises a string of serially-connected LEDs, wherein the first and second nodes comprise respective first and second terminal nodes of the string and wherein the at least one third node comprises an intermediate node of the string.

6. The apparatus of claim 2, wherein the first substrate further comprises a first port coupled to the power source and a second port coupled to the first port and to the first and second nodes of the at least two LEDs.

7. The apparatus of claim 6, wherein the first substrate further comprises a current control circuit coupled to the first and second ports.

8. The apparatus of claim 1, wherein the first and second substrates are planar and attached in a stacked arrangement.

9. The apparatus of claim 1, wherein at least one of the first and second substrates is disposed in a housing.

10. A device comprising:
a control circuit substrate configured to be mechanically attached to an LED substrate and comprising a switching circuit and a plurality of contacts coupled to the switching circuit and configured to be electrically coupled to corresponding contacts of the LED substrate,
wherein the switching circuit is configured to vary interconnections among at least two LEDs on the LED substrate responsive to a varying voltage produced by a power source to provide a plurality of different parallel and serial arrangements of the at least two LEDs including an arrangement wherein at least two parallel interconnected subsets of the at least two LEDs are connected in series with each other.

11. The device of claim 10, wherein the control circuit substrate comprises a first port configured to be coupled to the power source, a second port coupled to the first port, and wherein the plurality of contacts including at least one contact coupled to the second port and at least one contact coupled to the at least one terminal of the switching circuit.

12. The device of claim 11, wherein the switching circuit is configured to selectively bypass at least one LED of the at least two LEDs on the LED substrate responsive to the varying voltage at the first port.

13. The device of claim 12, wherein the varying voltage comprises an AC voltage.

14. The device of claim 11, wherein the control circuit substrate further comprises a current control circuit coupled to the first port and the second port.

15. The apparatus of claim 14, wherein the second planar substrate further comprises a first port configured to be coupled to the power source and a second port coupled to the first port and to at least one node of the at least two LEDs.

16. The apparatus of claim 15, wherein the second planar substrate further comprises a current control circuit coupled between the first and second ports.

17. The device of claim 11, wherein the control circuit substrate is planar and configured to be mechanically attached to the LED substrate in a stacked arrangement.

18. The apparatus of claim 17, further comprising a housing containing at least one of the first and second planar substrates.

19. An apparatus comprising;
a first planar substrate comprising at least two LEDs; and
a second planar second substrate mechanically attached to the first planar substrate in a stacked relationship and comprising a switching circuit electrically coupled to the at least two LEDs and configured to vary interconnections among the at least two LEDs responsive to a varying voltage produced by a power source to provide a plurality of different parallel and serial arrangements of the at least two LEDs including an arrangement wherein at least two parallel interconnected subsets of the at least two LEDs are connected in series with each other.

20. The apparatus of claim 19, wherein the switching circuit is configured to selectively bypass at least one LED of the at least two LEDs responsive to the varying voltage.

\* \* \* \* \*